United States Patent
Kreher et al.

(10) Patent No.: US 8,057,251 B2
(45) Date of Patent: Nov. 15, 2011

(54) STAY-TIGHT MECHANISM FOR COAXIAL GRADIENT COIL TERMINALS

(75) Inventors: Sabrina Kreher, Erlangen (DE);
Johann Schuster, Oberasbach (DE);
Stefan Stocker, Großenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/845,013

(22) Filed: Jul. 28, 2010

(65) Prior Publication Data

US 2011/0034059 A1 Feb. 10, 2011

(30) Foreign Application Priority Data

Aug. 5, 2009 (DE) .......................... 10 2009 036 233

(51) Int. Cl.
*H01R 13/58* (2006.01)
*H01R 9/05* (2006.01)

(52) U.S. Cl. ......... 439/470; 439/452; 439/459; 439/584

(58) Field of Classification Search .................. 439/445, 439/449, 450, 452, 459, 463, 470, 535, 578, 439/584
See application file for complete search history.

(56) References Cited

U.S. PATENT DOCUMENTS

| | | | |
|---|---|---|---|
| 2009/0111321 A1* | 4/2009 | Baldwin et al. | 439/471 |
| 2009/0191752 A1* | 7/2009 | Montena | 439/584 |
| 2011/0034054 A1* | 2/2011 | Schuster et al. | 439/312 |
| 2011/0034059 A1* | 2/2011 | Kreher et al. | 439/345 |

FOREIGN PATENT DOCUMENTS

DE    102006000927 A1    4/2007

* cited by examiner

*Primary Examiner* — James Harvey

(57) ABSTRACT

A stay-tight mechanism for a plug to be fixed with a union nut to a socket is provided. The mechanism has a first securing part having a flat engagement contour which engages with a flat of the union nut and having at least one recess. The mechanism has a second securing part having at least one recess and having an engagement contour which engages with an element on the connector when the first securing part is connected to the second securing part.

13 Claims, 8 Drawing Sheets

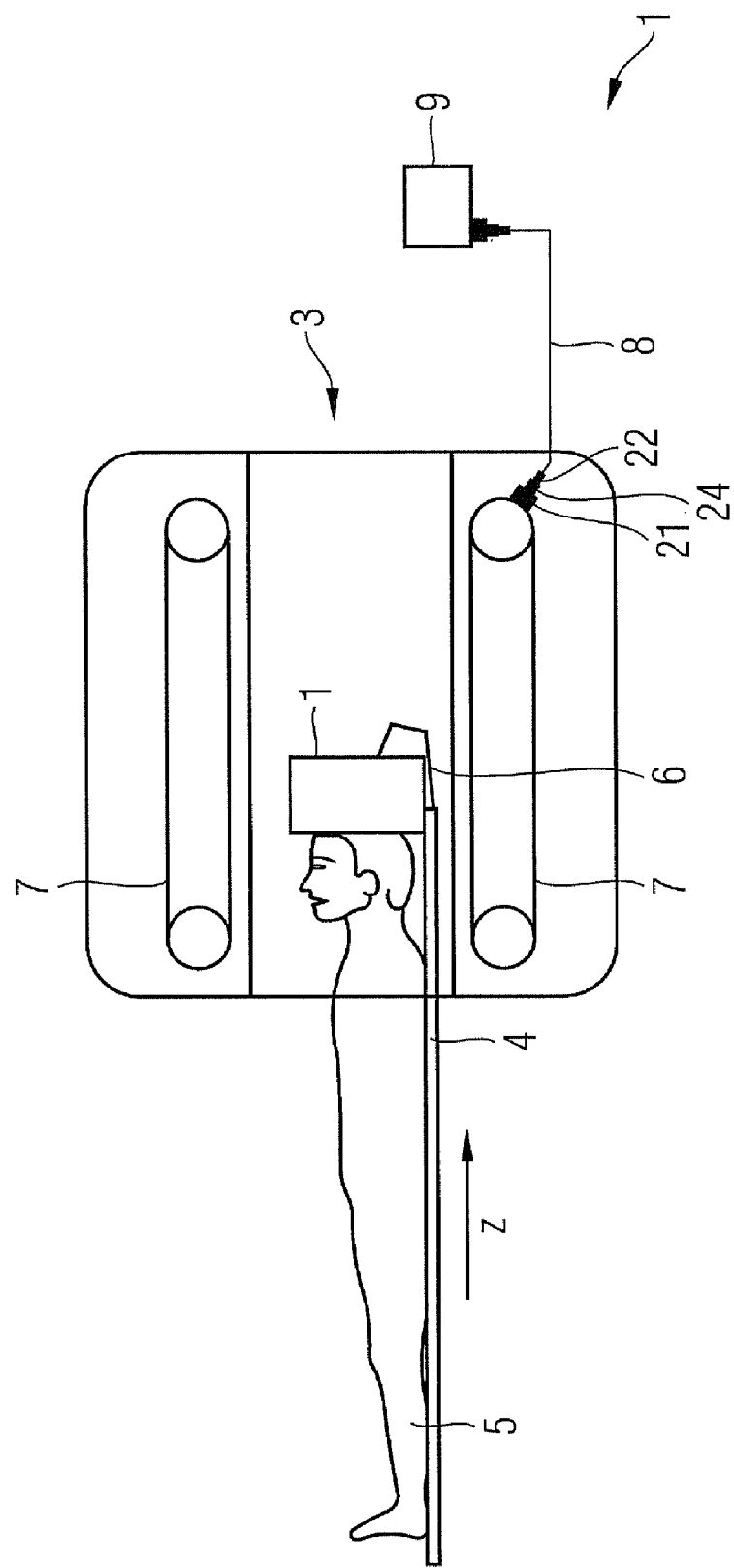

FIG 3
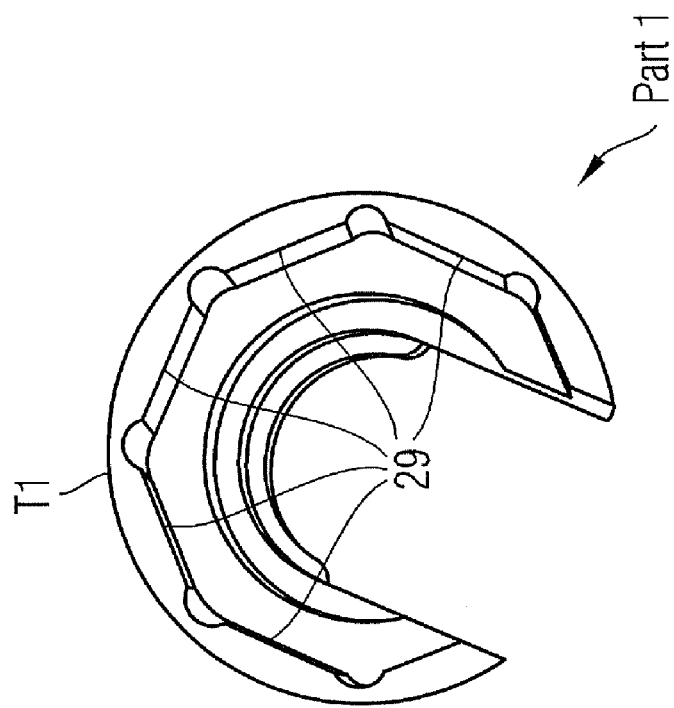
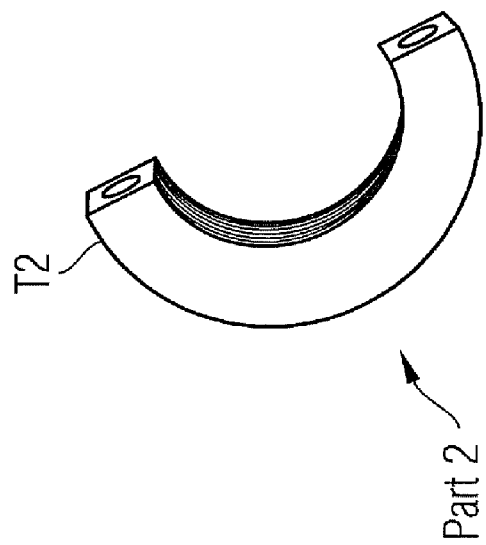

FIG 4
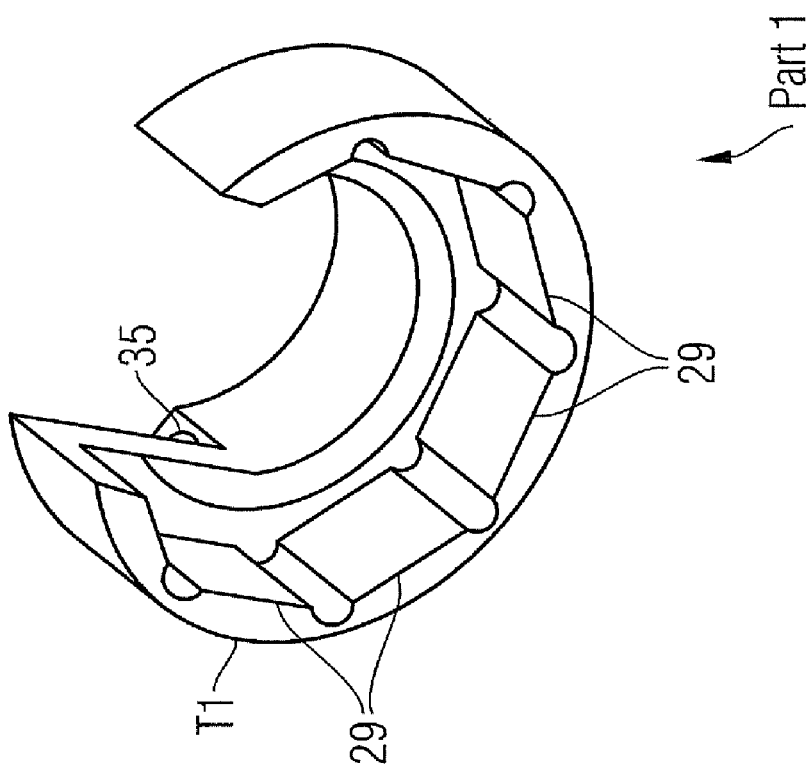
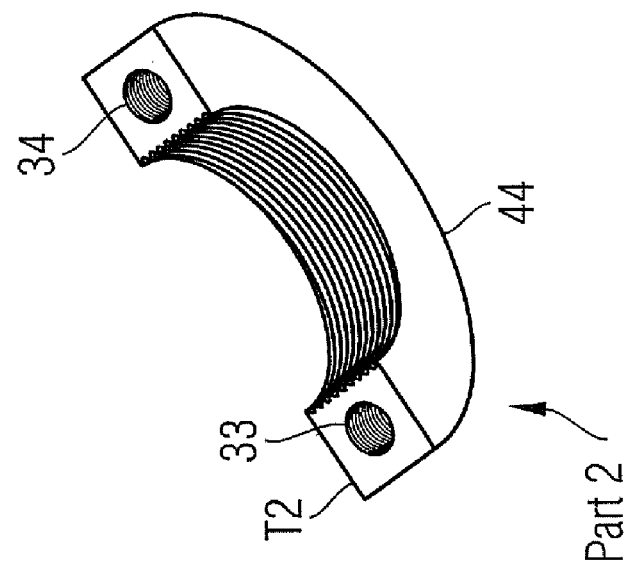

Section A-A

US 8,057,251 B2

STAY-TIGHT MECHANISM FOR COAXIAL GRADIENT COIL TERMINALS

CROSS REFERENCE TO RELATED APPLICATIONS

This application claims priority of German application No. 10 2009 036 233.9 filed Aug. 5, 2009, which is incorporated by reference herein in its entirety.

FIELD OF THE INVENTION

The invention relates to a stay-tight mechanism for a gradient coil terminal.

BACKGROUND OF THE INVENTION

Magnetic resonance devices, in particular for examining patients using magnetic resonance tomography (MR, MRT) are known for example from DE10314215B4.

Modern magnetic resonance systems operate with coils for transmitting high-frequency pulses with nuclear resonance excitation and/or for receiving induced magnetic resonance signals. Normally a magnetic resonance system has a permanent magnet or (more frequently) a superconducting coil to generate a so-called basic magnetic field (BH0) as homogeneously as possible in an examination area, a large whole body coil (also called body coil or BC) installed at a fixed position in the MR device and a number of small local coils (also called surface coils or LC). To read out information from which images of a patient can be generated, selected areas of the object or the patient to be examined are read out with gradient coils for three axes (e.g. X, Y roughly radial to the patient, Z in the longitudinal direction of the patient). The local encoding in magnetic resonance tomography is usually realized with the aid of a gradient coil system with three independently controllable, magnetically orthogonal gradient field coil systems. By overlaying the three freely-scalable fields (in three directions X, Y, Z) the orientation of the plane to be encoded ('gradient field') can be freely selected.

Previously, according to the internal prior art, gradient current terminals were pulled with a fine thread onto gradient current sockets and secured using a union nut. So that coaxial connections to gradient coils do not work loose, self-locking systems of the terminal are known according to the internal prior art through a dished washer pretensioning and a fine thread.

SUMMARY OF THE INVENTION

An object of the invention is to create an alternate and above all retrofittable locking device for a gradient coil terminal. The object is achieved by the subject matter of independent patent claim.

The invention provides a stay-tight mechanism for a plug to be fixed with a union nut to a socket, comprising:
- a first securing part with a flat engagement contour, which is able to be engaged with a flat of the union nut and with at least one recess,
- a second securing part with at least one recess and with an engagement contour, which when the first securing part is connected to the second securing part engages with an element on the plug.

The invention can especially be used for gradient coil plugs and gradient coil sockets. The invention is also able to be used however transferred to other sockets and plugs.

BRIEF DESCRIPTION OF THE DRAWINGS

Further features and advantages emerge from the further subclaims and a description given below of an exemplary embodiment which refers to the drawing. The figures show:

FIG. 1 a schematic diagram of a magnetic resonance device,

DETAILED DESCRIPTION OF THE INVENTION

Figure 2A:
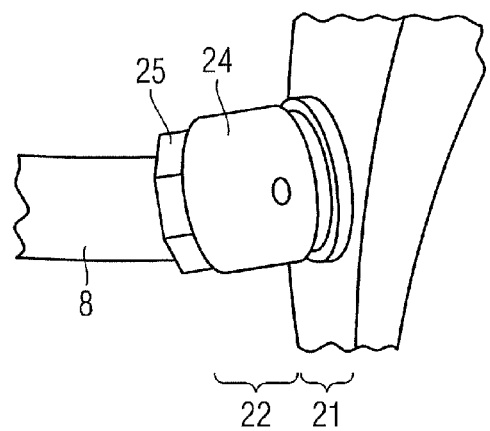
FIG. 2 four views of an inventive embodiment of a stay-tight mechanism for a gradient coil terminal, FIG. 3 viewed in perspective from above, two parts to secure a gradient coil plug to a gradient coil connecting socket, FIG. 4 viewed in perspective at an angle from above, two securing parts for securing a plug to a gradient coil connecting socket, FIG. 5 in a side view and an overhead view, a gradient coil plug on a cable and also a union nut and two securing parts for securing a gradient coil plug to a gradient coil connecting socket, FIG. 6 a further example viewed from above of a gradient coil plug on a cable as well as a union nut and two securing parts for securing a gradient coil plug to a gradient coil connecting socket, FIG. 7 a longitudinal section viewed along the cut line B-B in FIG. 6, FIG. 8 an overhead view of the arrangement in FIG. 6 and FIG. 9 a transverse view along the cut line A-A in FIG. 6.

FIG. 1 shows a magnetic resonance tomography device (MRT) 1 with a whole body coil and a tubular-shaped chamber 3, in which a patient couch 4 with a patient 5 for example and a local coil 6 can be moved in direction z in order to generate MRT images of the patient 5. A gradient coil 7 is connected via gradient coil cables 8 to a controller 9 shown schematically and in simplified form, with a gradient coil plug 22 being located at one end of a gradient coil cable 8, which can be connected (plugged into) a gradient coil connecting socket 21 on the controller 9 and can be secured there with a union nut 24.

The union nut 24 can be arranged for example on the gradient coil plug 23 to allow turning movement. The union nut 24 can for example, in a manner perhaps known per se, be secured by an edge K (FIG. 5) on the gradient coil plug 22 or gradient cable 8 against shaking loose from the gradient coil plug 22 or from the gradient coil cable 8. The union nut 24 is able to be screwed with a thread 55 over a thread 56 onto the gradient coil socket 21 of the controller 9.

The union nut 24 is able to be locked onto the gradient coil plug and/or the gradient coil socket and/or the cable 8 by means of securing parts T1, T2, as described below with reference to FIG. 2ff.

FIGS. 2a-d show a number of views of a stay-tight mechanism for a plug (here a gradient coil plug) able to be fixed to a socket (here a gradient coil socket) for an MRT.

In FIG. 2a a union nut 24 with a thread (55 in FIG. 5) is screwed via a thread (56 in FIG. 5) onto a gradient coil socket 21 on gradient coil system (or alternately onto the controller 9).

For assembly the first securing part T1 is placed onto the union nut to be secured so that a flat of the first securing part engages with a flat engagement contour of the union nut. Then the second securing part T2 (in relation to the coaxial cable or plug surrounded by T1 and T2) is placed on the opposite side of the cable to the first securing part T1 and the second securing part T2 is connected to the first securing part T1, by at least one screw 37 being screwed through a screw connection recess 35, 36 on the first securing part T1 and a screw connection recess on the second securing part T2. The screw connection recesses can have threads; alternately they can be through-holes and the screws 37 can be secured by nuts.

Figure 2B:
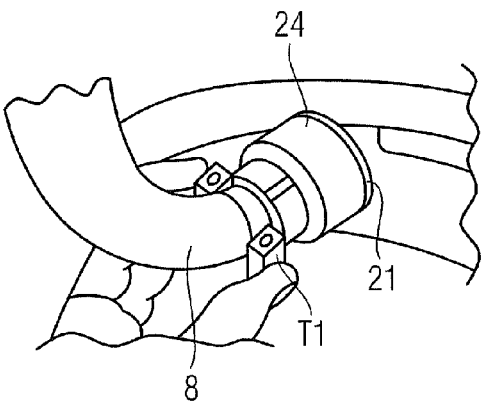

In FIG. 2b a first securing part T1 (the lower half shell shown) is placed with its flat engagement contour (29 in FIG. 3-5) onto a flat (25 in FIG. 5) of the union nut 24 to make a form fit.

Figure 2C:
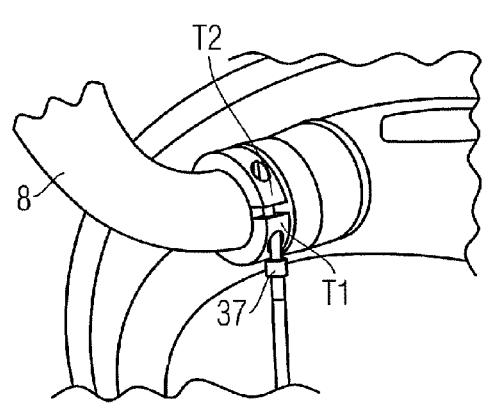
Figure 2D:
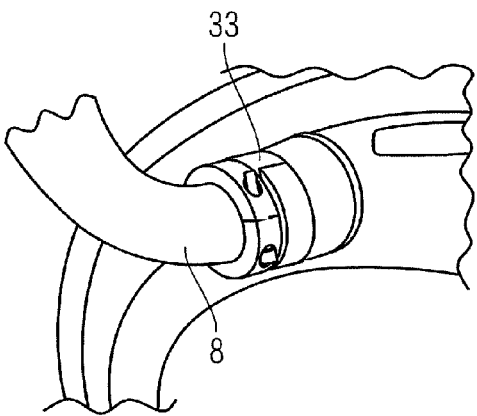

In FIG. 2c a second securing part T2 is placed to make a form fit onto the first securing part T1.

By tightening the screw(s) 37 the securing parts T1, T2 are pressed against each other and engagement contour 44 (e.g. an inner thread) on the second securing part T2 and/or on the first securing part T1 is pressed into an element 8 on the plug side, i.e. into a coaxial cable 8 or into a copper tube of a coaxial cable on the plug 22 side or a part of the plug) and is thereby secured against rotation (and against shaking loose in the longitudinal direction of the cable). This means that the union nut 24 is also secured by being in contact with a securing part T1 and the (in this case form-fit) engagement of a securing part T2 on the cable 8 against rotation (and also against shaking loose in the longitudinal direction of the cable here) and thereby in the state in FIG. 2d against coming loose from a thread (56) on the gradient coil socket 21.

An embodiment of the invention comprises an readjustable, at least two-part stay-tight mechanism, which on assembly guarantees a form-fit contact to the coaxial terminal and prevents the connection from coming loose.

The possible advantages, depending on the embodiment of the invention, can be as follows:
an ability to be retrofitted even in a magnetic field,
simple installation without a special tool,
parts able to be manufactured at low cost,
a robust solution,
able to be used with normal system types with coaxial terminals, An exemplary embodiment for a two-part device is described here.

Figure 5:
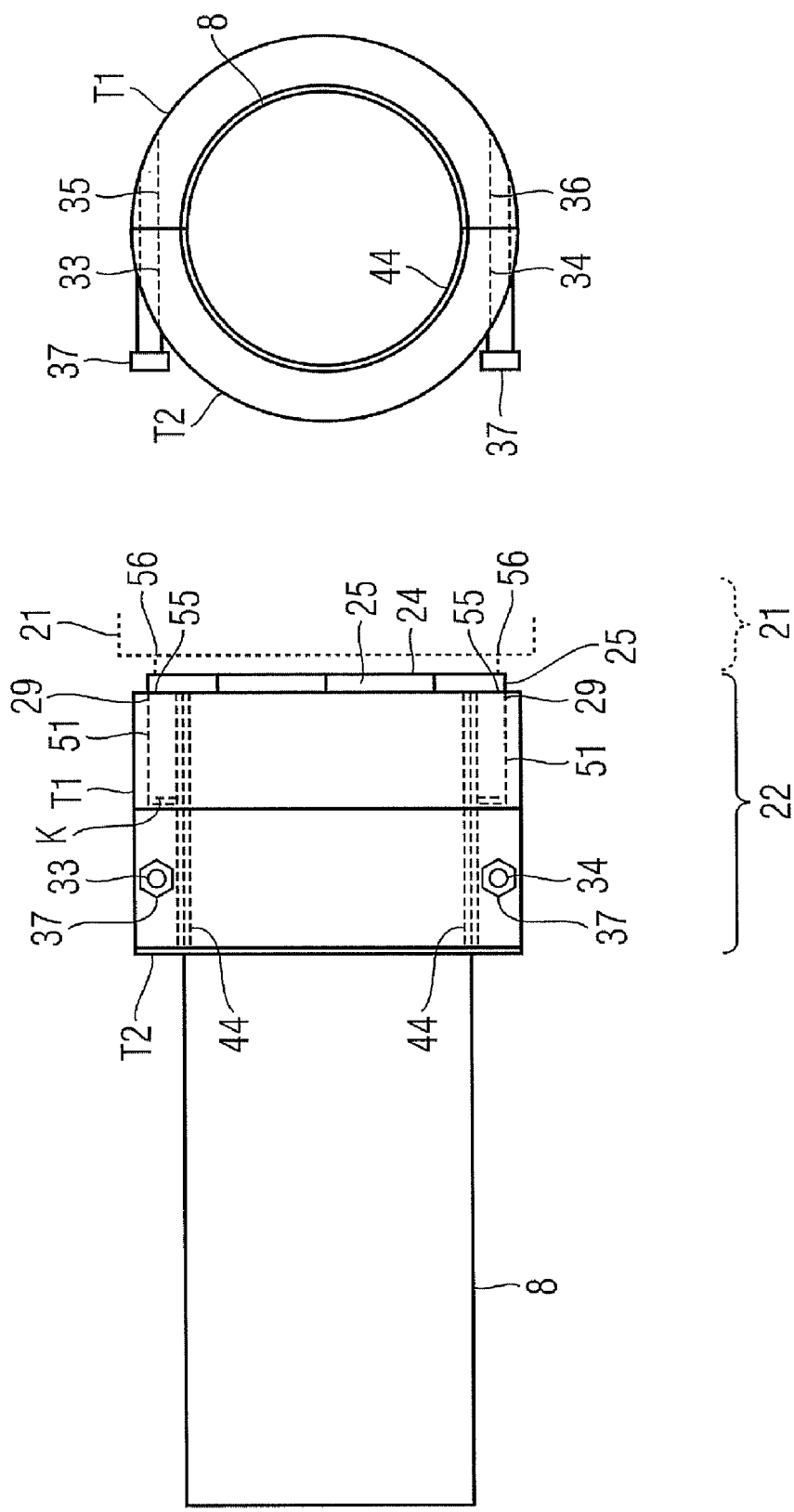

In FIGS. 3, 4 and 5 a first securing part T1 has internal flats 29.

In FIG. 5 internal flats 29 of a first securing part T1 mate with flats 25 (e.g. hexagon or octagon or other) of a union nut 24 on the coaxial gradient current terminal 21, 22 and move into contact on the latter.

The first securing part T1 can thus be pushed onto a union nut 24 already tightened (on a thread 56 of the gradient coil socket 21) and makes a form fit with the union nut 24.

An inner thread (e.g. a fine thread, here a left-hand thread) is cut into the first part T1. The second part T2 likewise contains a (left-hand) internal thread. An alternate embodiment could for example contain a knurled or similar surface profile instead of the left-hand thread.

If the second part T2 is screwed onto the first part T1 the engagement contour (the left-hand thread) is pressed into the soft copper tube of the coaxial cable 8 and once again makes a form fit with the latter. The form fit of the securing part T2 with the cable 8 (e.g. with its fixed copper tube) then counteracts a loosening of the union nut 24 from a thread 56 on the gradient coil socket 56 side. In a state in which the first securing part T1 is screwed to the second securing part T2, an engagement contour (such as an internal thread) of the second securing part T2 is pressed here into a coaxial cable or into the copper tube of a coaxial cable by the connector and makes a form fit with the latter, which avoids the union nut coming loose from the gradient coil socket.

A threadlocker (e.g. Loctite 270) to be used for at least one screw connecting the first part T1 to the second part T2 also increases the tightness.

Figure 6:
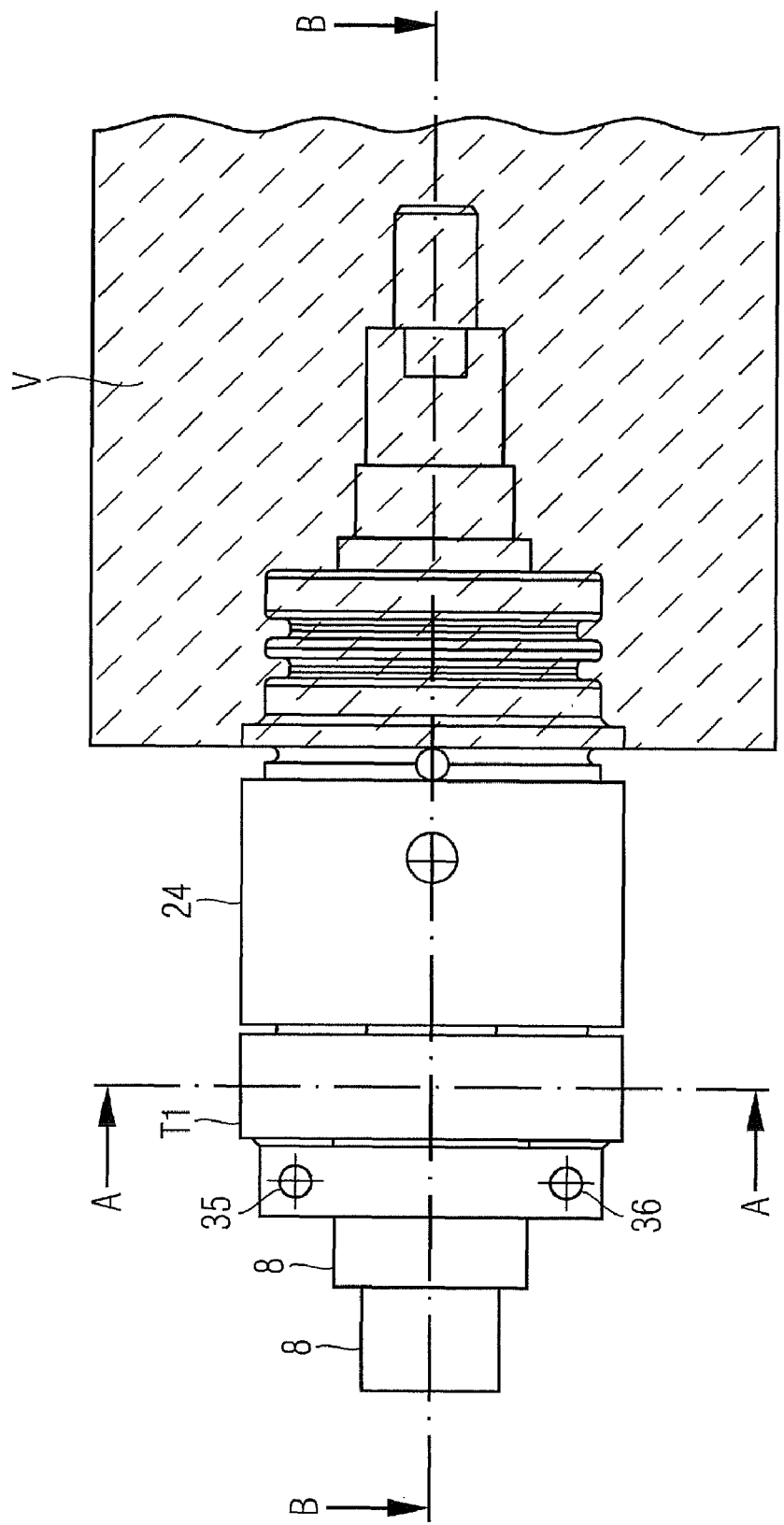
Figure 7:
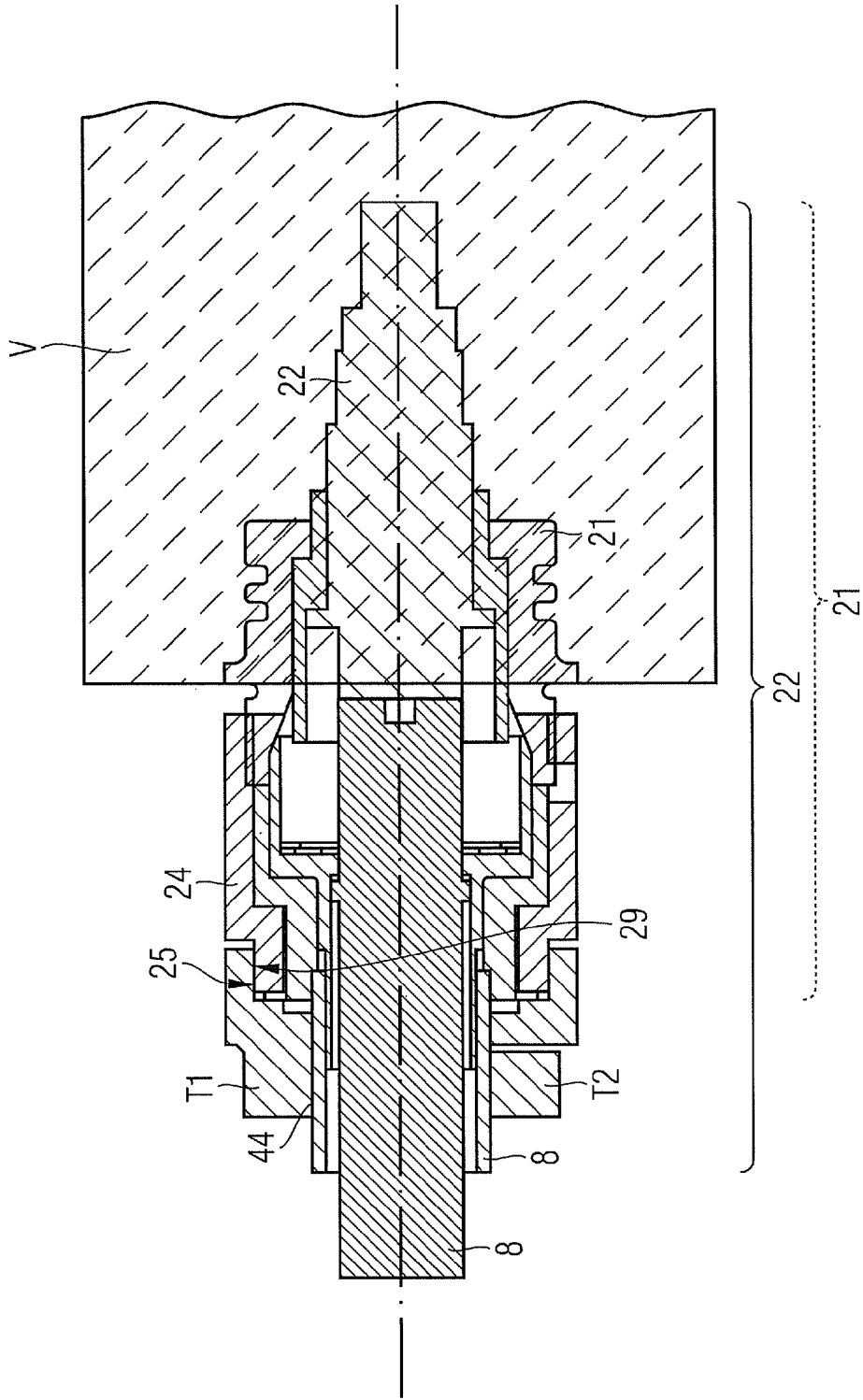
Figure 8:
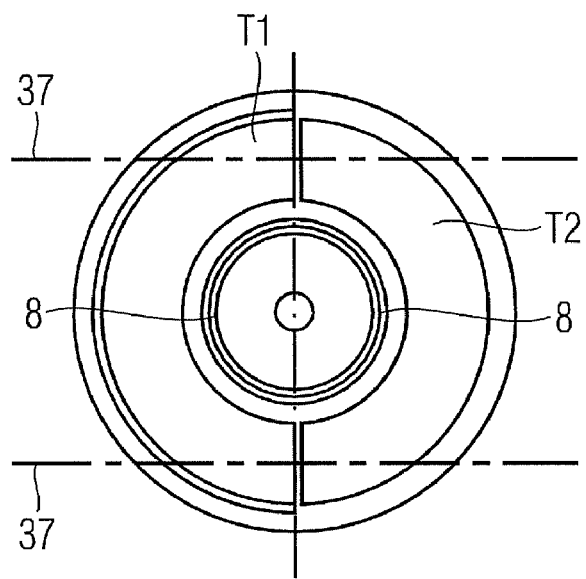
Figure 9:
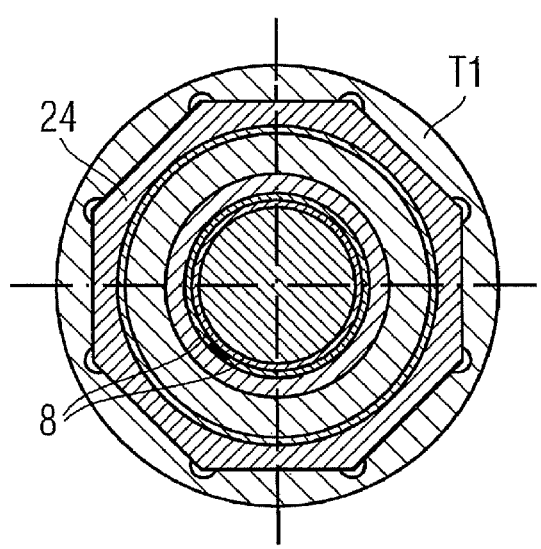

FIG. 6, as section B-B, FIG. 7, as overhead view, FIG. 8 and FIG. 9 as a view along a transverse section through cut line A-A show as an example a stay-tight mechanism T1, T2, 24 for a gradient coil plug 22 to be retained by a union nut 24 and securing parts T1, T2 to a gradient coil socket 21 (on a cast part V of a gradient system).

The stay-tight mechanism comprises a first securing part T1 with a flat engagement contour 29, which is able to be engaged with a flat 25 of the union nut 24 and further with at least one recess for screws 37, as well as a second securing part T2 with at least one recess for screws 37 and with the left-hand thread 44, which when the first securing part T1 is connected to the second securing part T2 (e.g. with screws 37) is in engagement with a gradient coil cable 8 (which with a coaxial connector comprises an inner cable and an outer cable surrounding this cable) at the connector 22.

In this case the first securing part T1 and the second securing part T2 each have a left-hand thread which is pressed onto the gradient coil cable and avoids the union nut coming loose.

The invention claimed is:

1. A stay-tight mechanism for a plug to be fixed with a union nut to a socket, comprising:
a first securing part comprising a flat engagement contour which engages with a flat of the union nut; and
a second securing part comprising an engagement contour which engages with an element on the plug when the first securing part is connected to the second securing part;
the first securing part comprises a first half shell.

2. The stay-tight mechanism as claimed in claim 1, wherein the second securing part comprises a second half shell having a same internal diameter as the first half shell of the first securing part, and
wherein the internal diameter corresponds to an external diameter of a cable fixed to the plug.

3. The stay-tight mechanism as claimed in claim 1, wherein the flat engagement contour is a multi-flat screw.

4. The stay-tight mechanism as claimed in claim 1, wherein the engagement contour of the second securing part is pressed into a cable or a copper tube of the cable when the first securing part is screwed to the second securing part.

5. The stay-tight mechanism as claimed in claim 1, wherein the engagement contour of the second securing part makes a form fit with the element on the plug when the first securing part is screwed to the second securing part.

6. The stay-tight mechanism as claimed in claim 1, wherein the first securing part and the second securing part comprise an inner thread respectively and fasteners pass through the inner thread when the first securing part is screwed to the second securing part.

7. The stay-tight mechanism as claimed in claim 1, further comprising a screw for connecting the first securing part to the second securing part.

8. The stay-tight mechanism as claimed in claim 1, further comprising two screws for connecting the first securing part to the second securing part.

9. The stay-tight mechanism as claimed in claim 1, wherein the plug is a gradient coil plug and the socket is a gradient coil socket.

10. The stay-tight mechanism as claimed in claim 1, wherein the first securing part comprises a left-hand thread.

11. The stay-tight mechanism as claimed in claim 1, wherein the second securing part comprises a left-hand thread.

12. The stay-tight mechanism as claimed in claim 1, wherein the element is a cable.

13. The stay-tight mechanism as claimed in claim 12, wherein the cable is a coaxial cable.

* * * * *